(12) United States Patent
Cheng et al.

(10) Patent No.: US 12,080,650 B1
(45) Date of Patent: Sep. 3, 2024

(54) INTERCONNECT STRUCTURE WITH LOW CAPACITANCE AND HIGH THERMAL CONDUCTIVITY

(71) Applicant: Taiwan Semiconductor Manufacturing Company, Ltd., Hsinchu (TW)

(72) Inventors: Kai-Fang Cheng, Taoyuan (TW); Hsiao-Kang Chang, Hsinchu (TW); Ming-Han Lee, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/544,100

(22) Filed: Dec. 18, 2023

Related U.S. Application Data

(60) Provisional application No. 63/593,140, filed on Oct. 25, 2023.

(51) Int. Cl.
*H01L 21/768* (2006.01)
*H01L 23/373* (2006.01)
*H01L 23/522* (2006.01)
*H01L 23/532* (2006.01)

(52) U.S. Cl.
CPC .. *H01L 23/53295* (2013.01); *H01L 21/76802* (2013.01); *H01L 21/7682* (2013.01); *H01L 21/76831* (2013.01); *H01L 23/3735* (2013.01); *H01L 23/5226* (2013.01); *H01L 23/53238* (2013.01); *H01L 21/7685* (2013.01)

(58) Field of Classification Search
None
See application file for complete search history.

(56) References Cited

U.S. PATENT DOCUMENTS

| | | | |
|---|---|---|---|
| 11,652,149 B2 | 5/2023 | Chang | |
| 11,658,215 B2 | 5/2023 | Su | |
| 2013/0001682 A1* | 1/2013 | Tang | H01L 27/1203 438/270 |
| 2015/0380302 A1 | 12/2015 | Mountsier | |
| 2017/0207120 A1 | 7/2017 | Boyanov | |
| 2020/0350354 A1 | 11/2020 | Park | |
| 2022/0238373 A1 | 7/2022 | Chuang | |

FOREIGN PATENT DOCUMENTS

JP    2002050683 A    2/2002

* cited by examiner

*Primary Examiner* — Joseph C. Nicely
*Assistant Examiner* — Lamont B Koo
(74) *Attorney, Agent, or Firm* — HAYNES AND BOONE, LLP

(57) ABSTRACT

Contact structures and methods of forming the same are provided. A contact structure according to the present disclosure includes an etch stop layer (ESL), a first pillar feature and a second pillar feature disposed on the ESL, a metal feature disposed between the first pillar feature and the second pillar feature, the metal feature including a first sidewall, a bottom surface, a second sidewall, and a top surface, a dielectric liner extending continuously from a top surface of the first pillar feature, along the first sidewall, the bottom surface and the second sidewall of the metal feature, and onto a top surface of the second pillar feature, and a gap between the first pillar feature and a portion of the dielectric liner that extends along the first sidewall of the metal feature.

20 Claims, 26 Drawing Sheets

US 12,080,650 B1

INTERCONNECT STRUCTURE WITH LOW CAPACITANCE AND HIGH THERMAL CONDUCTIVITY

PRIORITY DATA

The present application claims the benefit of U.S. Provisional Application No. 63/593,140, filed Oct. 25, 2023, the entirety of which is herein incorporated by reference.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As device dimensions continue to shrink, performance of back-end-of-line (BEOL) interconnect structures are subject to higher requirements. For example, low dielectric constant (low-k) materials have been incorporated into interconnect structures to lower capacitance. While the low-k materials serve their purposes of lowering capacitance, their lackluster thermal conductivities present challenges in dissipation of heat from front-end-of-line (FEOL) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
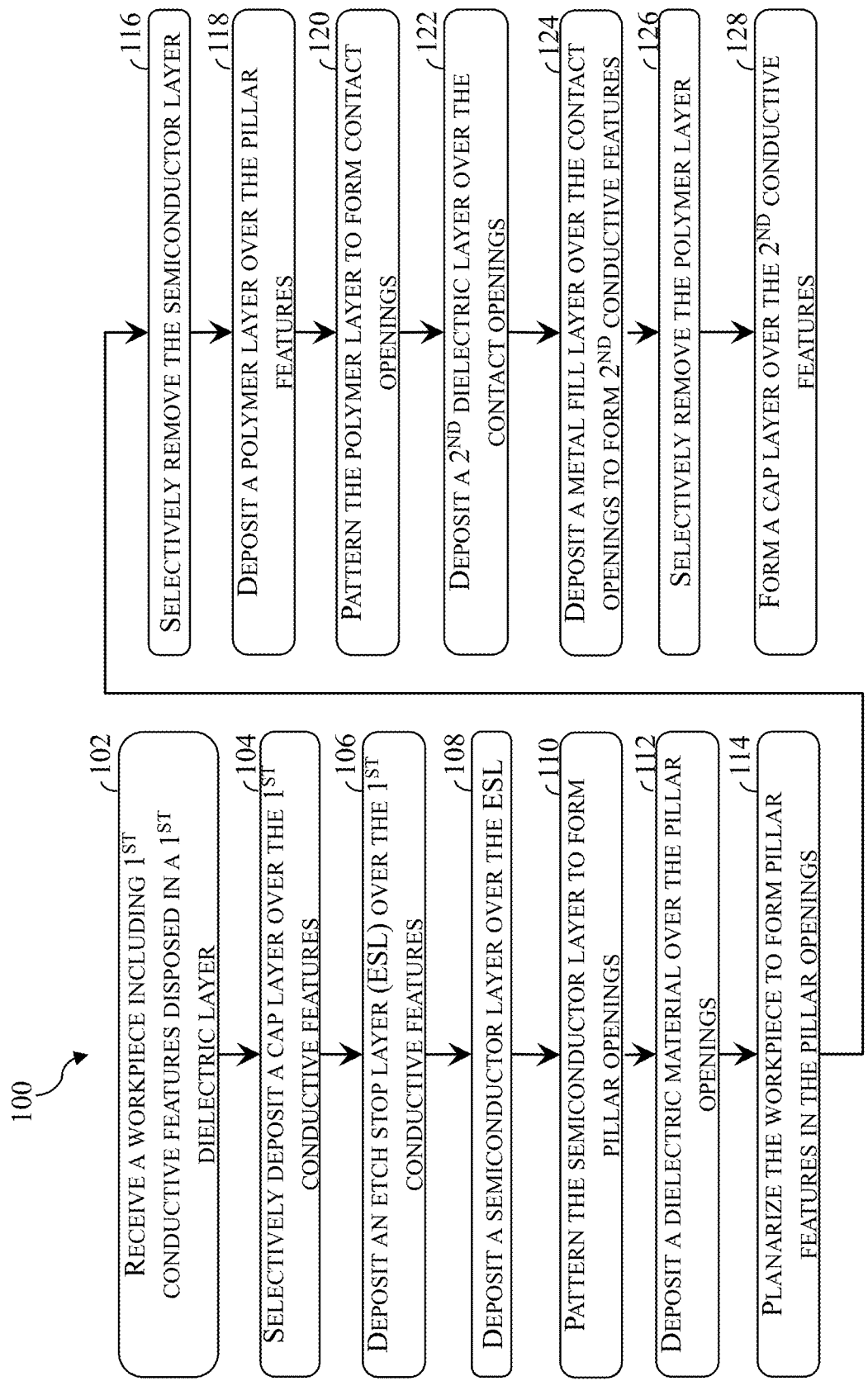
FIG. 1 is a flowchart of a method 100 for forming a contact structure, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +1-15% by one of ordinary skill in the art. Source/drain region(s) may refer to a source or a drain, individually or collectively, dependent upon the context.

As the front-end-of-line (FEOL) devices becomes smaller, the back-end-of-line (BEOL) interconnect structures play a greater role in keeping up with the power, performance and area requirements. The BEOL interconnect structures may include low-k dielectric material to keep the parasitic capacitance low. In general, low-k dielectric materials possess thermal conductivities lower than those of high-k dielectric materials, metals or semiconductor materials. For example, a thermal conductivity of silicon oxide is two orders of magnitude lower than that of silicon. The low thermal conductivities of low-k dielectric materials prevent them from effectively dissipate heat generated by the FEOL devices. When it comes to dielectric materials in the BEOL interconnect structures, the industry scrambles to find a solution to achieve high thermal conductivity while keeping a low parasitic capacitance.

The present disclosure provides methods to form a contact structure that includes high thermal conductivity pillar features for heat dissipation and low-k dielectric structures for capacitance reduction. In an example process, pillar features are formed over an etch stop layer. The pillar features are formed of diamond or aluminum nitride. A sacrificial polymer layer is then deposited over the pillar features. The sacrificial polymer layer is then patterned to form contact openings. A liner is then conformally deposited over the contact openings. After conductive features are formed in the contact openings, a thermal treatment is performed to selectively remove the sacrificial polymer layer, leaving air gaps in spaces defined by the pillar features and liner. The pillar features, which are formed of materials with good thermal conductivities, facilitate heat dissipation. The air gaps between conductive features help keep a low capacitance.

The various aspects of the present disclosure will now be described in more detail with reference to the figures. In that regard, FIGS. 1 and 20 are flowcharts illustrating method 100 and method 300 for forming a contact structure on a workpiece 200. Methods 100 and 300 are merely examples and are not intended to limit the present disclosure to what is explicitly illustrated in method 100 or method 300. Additional steps may be provided before, during and after method 100 or method 300, and some steps described can be replaced, eliminated, or moved around for additional embodiments of the method 100 or method 300. Not all steps are described herein in detail for reasons of simplicity. Method 100 is described below in conjunction with FIGS. 2-19, which are fragmentary cross-sectional views of a workpiece 200 at different stages of fabrication according to embodiments of method 100. Method 300 is described below in conjunction with FIGS. 2-9, 11-12 and 21-26, which are fragmentary cross-sectional views of a workpiece 200 at different stages of fabrication according to embodiments of method 300. Because the workpiece 200 will be fabricated into a semiconductor structure 200 upon conclusion of the fabrication processes, the workpiece 200 may be referred to as a semiconductor structure 200 as the context requires. Additionally, throughout the present application and across different embodiments, like reference numerals denote like features with similar structures and compositions, unless otherwise excepted. Source/drain region(s) may refer to a source or a drain, individually or collectively, dependent upon the context.

Figure 2:
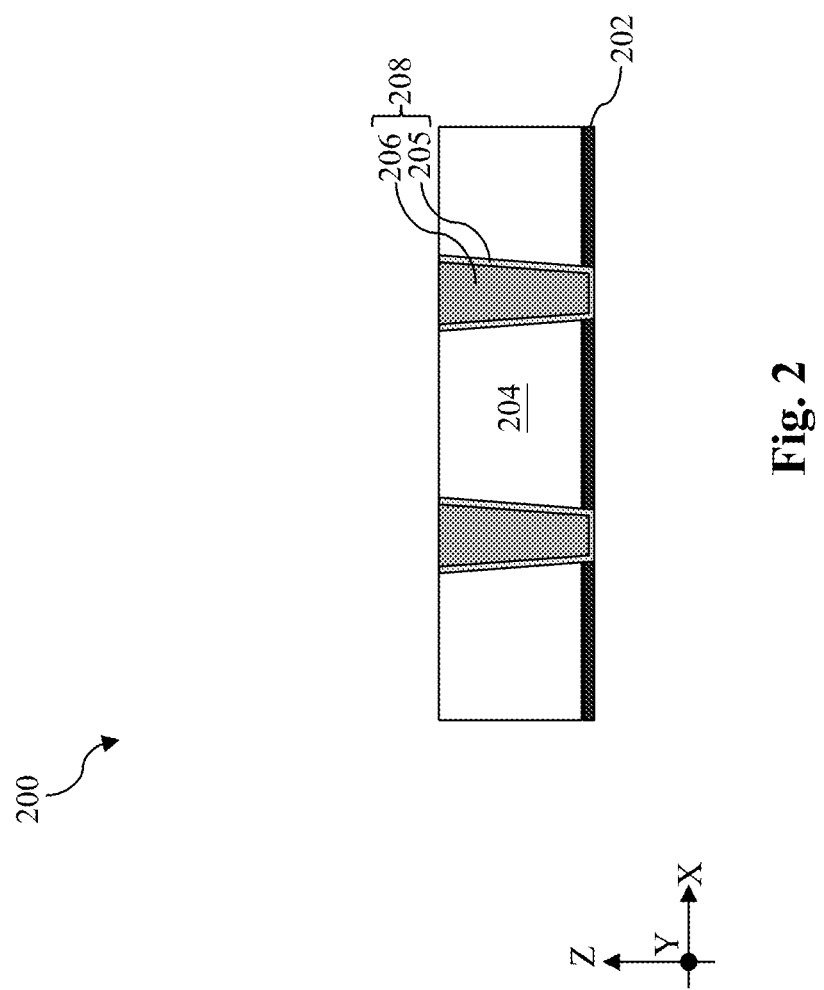
FIGS. 2-19 are fragmentary cross-sectional views of a workpiece at various stages of fabrication according to the method in FIG. 1, according to one or more aspects of the present disclosure.

Referring to FIGS. 1 and 2, method 100 includes a block 102 where a workpiece 200 is received. The workpiece 200 includes a lower etch stop layer (ESL) 202, a first dielectric layer 204 disposed over the lower ESL 202, and first conductive features 208 extending through the first dielectric layer 204 and the lower ESL 202. The workpiece 200 is representative of a metallization layer in a BEOL interconnect structure and the first conductive features 208 represent a metal line, a contact via, or a dual-damascene feature that includes a metal line and a contact via. In some embodiments, the lower ESL 202 includes aluminum oxide, aluminum nitride, silicon nitride, silicon oxycarbide, silicon carbonitride, or a combination thereof. The first dielectric layer 204 may include a low dielectric constant (low-k) dielectric material that has a dielectric constant smaller than that of silicon oxide, which is about 3.9. For example, the first dielectric layer 204 may include a porous organosilicate thin film (e.g., SiOCH), tetraethylorthosilicate (TEOS) oxide, un-doped silicate glass, borophosphosilicate glass (BPSG), fluorosilicate glass (FSG), phosphosilicate glass (PSG), fluorine-doped silicon dioxide, carbon-doped silicon dioxide, porous silicon dioxide, porous carbon-doped silicon dioxide, silicon oxycarbonitride (SiOCN), boron carbonitride, spin-on silicon based polymeric dielectrics, or combinations thereof. In some instances, the first dielectric layer 204 may be referred to as an interlayer dielectric (ILD) layer or an intermetal dielectric (IMD) layer. Each of the first conductive features 208 includes a barrier layer 205 to interface the first dielectric layer 204 and the lower ESL 202 and a metal fill layer 206 over the barrier layer 205. The barrier layer 205 may include titanium nitride (TiN), cobalt nitride (CoN), manganese nitride (MnN), nickel nitride (NiN), tungsten nitride (WN), or tantalum nitride (TaN). The first metal fill layer 206 may include copper (Cu), nickel (Ni), cobalt (Co), ruthenium (Ru), iridium (Ir), aluminum (Al), platinum (Pt), palladium (Pd), gold (Au), silver (Ag), osmium (Os), tungsten (W), or molybdenum (Mo), or a combination thereof.

Figure 3:
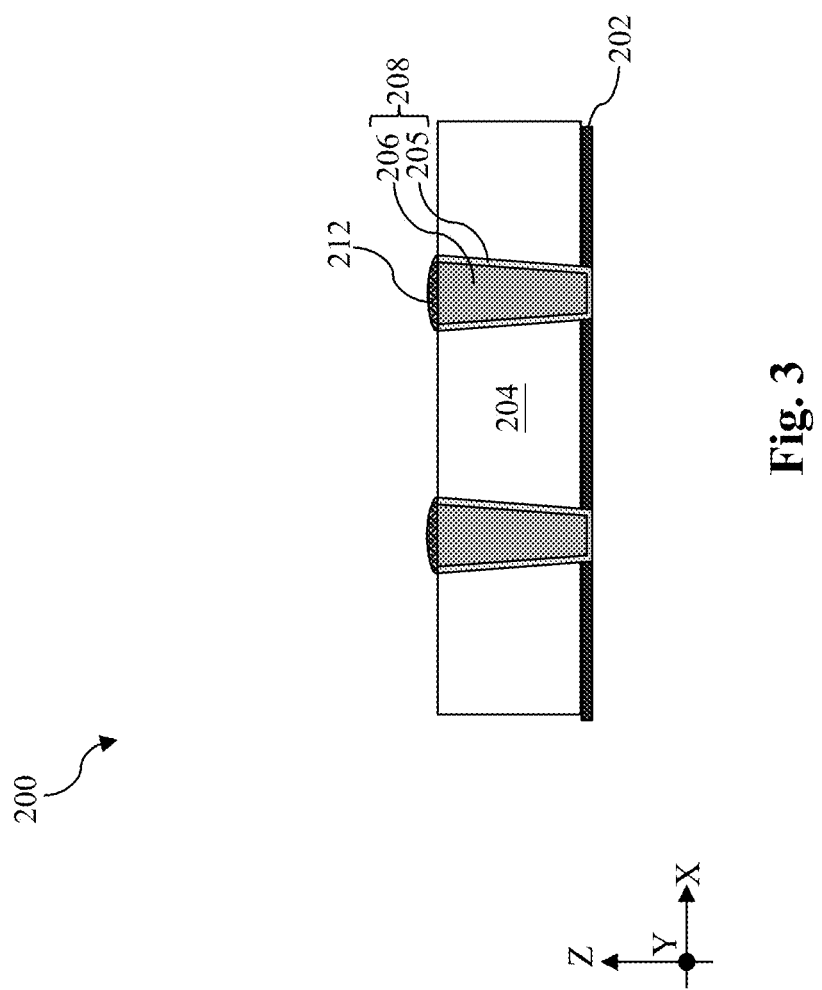

Referring to FIGS. 1 and 3, method 100 includes a block 104 where a first cap layer 212 is selectively deposited over the first conductive feature 208. The first cap layer 212 may also be referred to as a metal cap 212 or a conductive cap layer 212 and is formed from a metal different from the metal that forms the barrier layer 205 and the metal fill layer 206. In embodiments where the metal fill layer 206 is formed of copper, the first cap layer 212 may include titanium (Ti), tantalum (Ta), molybdenum (Mo), nickel (Ni), cobalt (Co), ruthenium (Ru), or tungsten (W) other refractory metals. In the depicted embodiment, the first cap layer 212 includes cobalt (Co). In some implementations, at block 104, the first cap layer 212 is selectively deposited on top surfaces of the first conductive features 208 by metal organic chemical vapor deposition (MOCVD) using metalorganic precursors each having a metal ion and coordinating ligands. An example cobalt metalorganic precursor may be cyclopentadienylcobalt dicarbonyl (($C_5H_5$)$Co(CO)_2$. As shown in FIG. 3, due to the selective nature of formation, the first cap layer 212 is only deposited on top surfaces of the barrier layer 205 and the metal fill layer 206 and is absent from the surfaces of the first dielectric layer 204. Additionally, it has been observed that the first cap layer 212 may be thicker in the center region than around the edge, giving the first cap layer 212 a slight dome profile in a cross-sectional view shown in FIG. 3. The first cap layer 212 functions to suppress electromigration or hillock formation of the metal fill layer 206. Besides serving to reduce electromigration, the first cap layer 212 may also repair damages done to the metal fill layer 206 during a planarization process.

Figure 4:
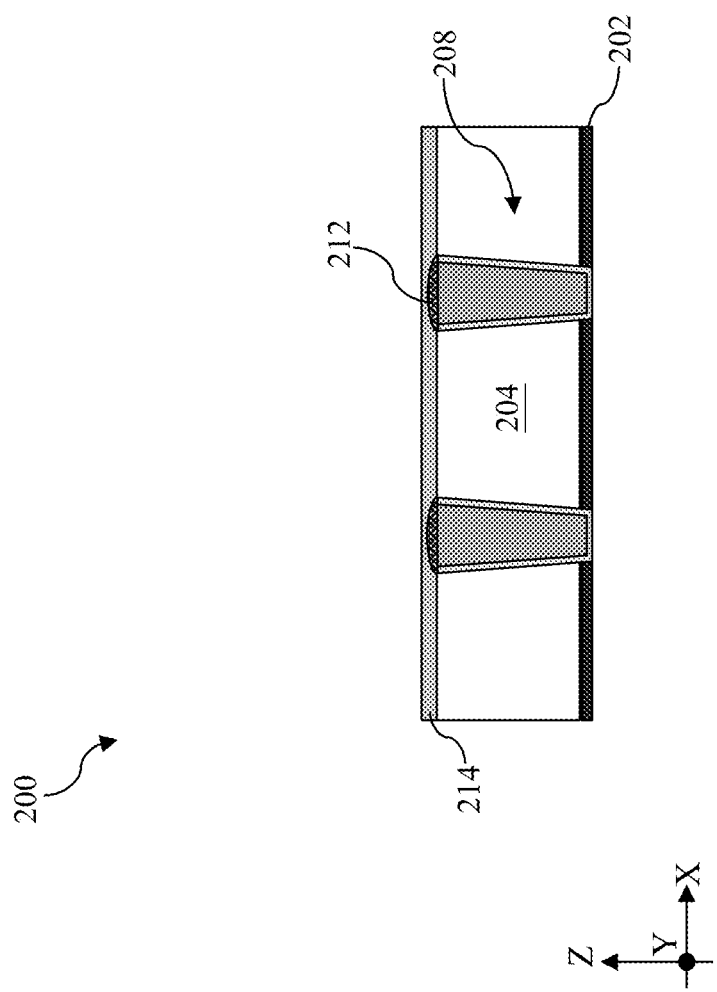

Referring to FIGS. 1 and 4, method 100 includes a block 106 where an etch stop layer (ESL) 214 is deposited over the first conductive feature 208. In some embodiments, the ESL 214 may include a metal nitride, such as aluminum nitride (AlN). When the ESL 214 includes aluminum nitride (AlN), the ESL 214 may be deposited using atomic layer deposition (ALD), physical vapor deposition (PVD), chemical vapor deposition (CVD), or plasma enhanced CVD (PECVD). The deposition of the ESL 214 may include use of an aluminum-containing precursor, such as trimethylaluminum (Al(CH$_3$)$_3$) and a nitrogen-containing precursor, such as ammonia (NH$_3$). In some implementations, the deposited ESL 214 may be subject to a plasma treatment that includes helium (He), argon (Ar), or a combination thereof. The plasma treatment may improve the integrity and density of the ESL 214. In some instances, the ESL 214 may have a thickness between about 20 Å and about 50 Å.

Figure 5:
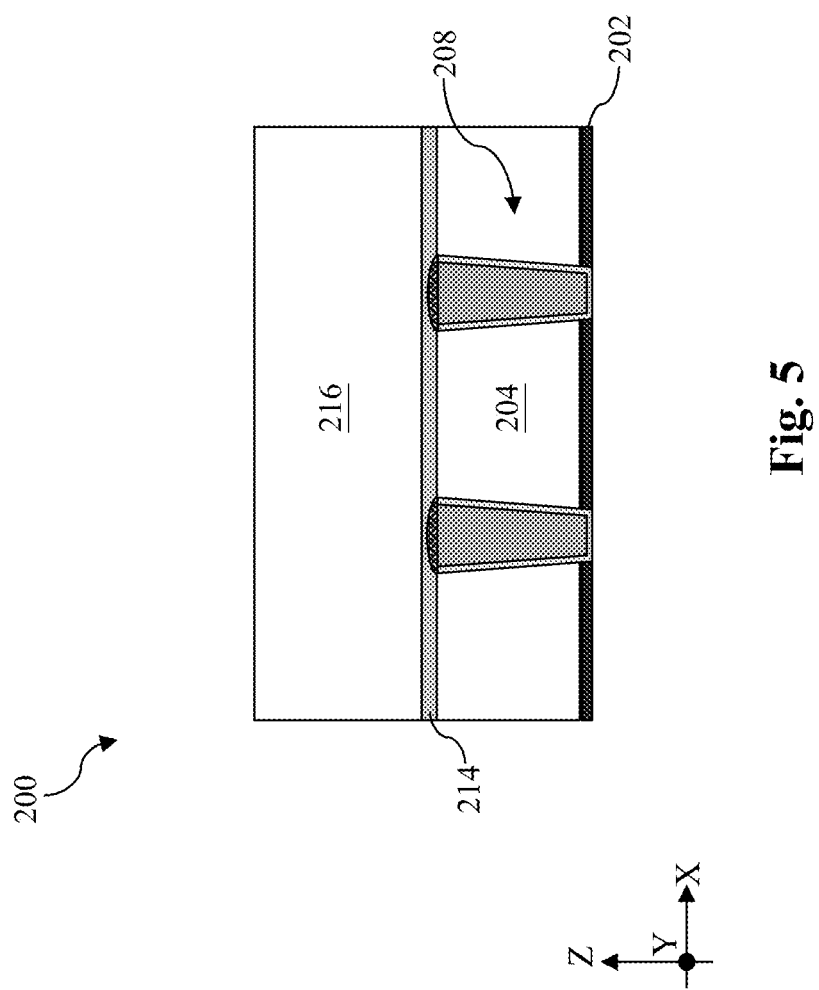
Figure 6:
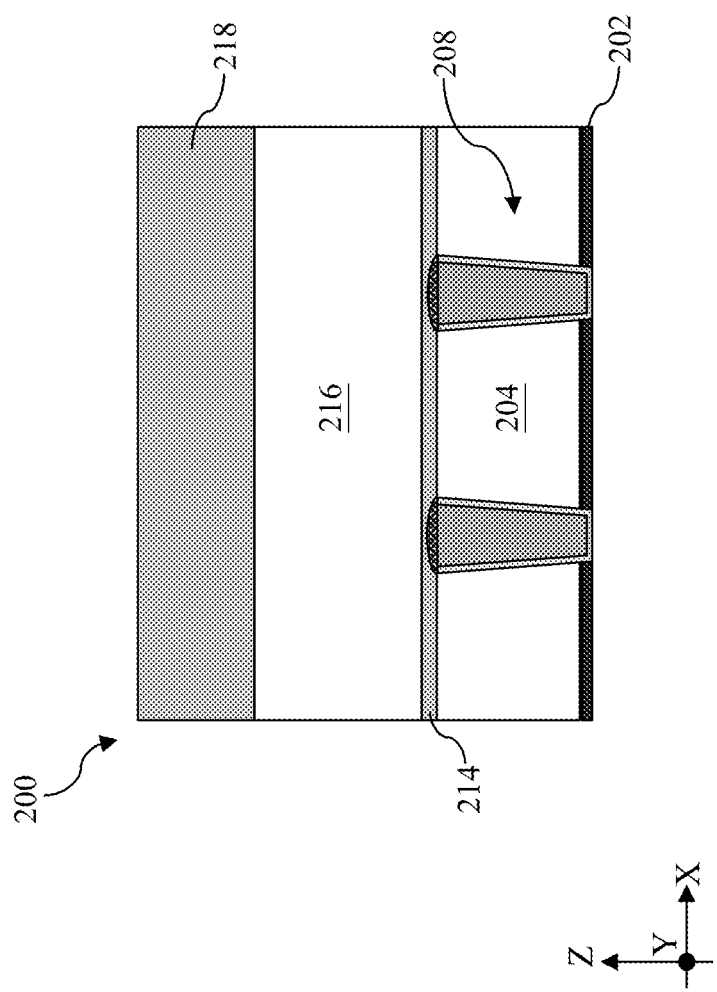
Figure 7:
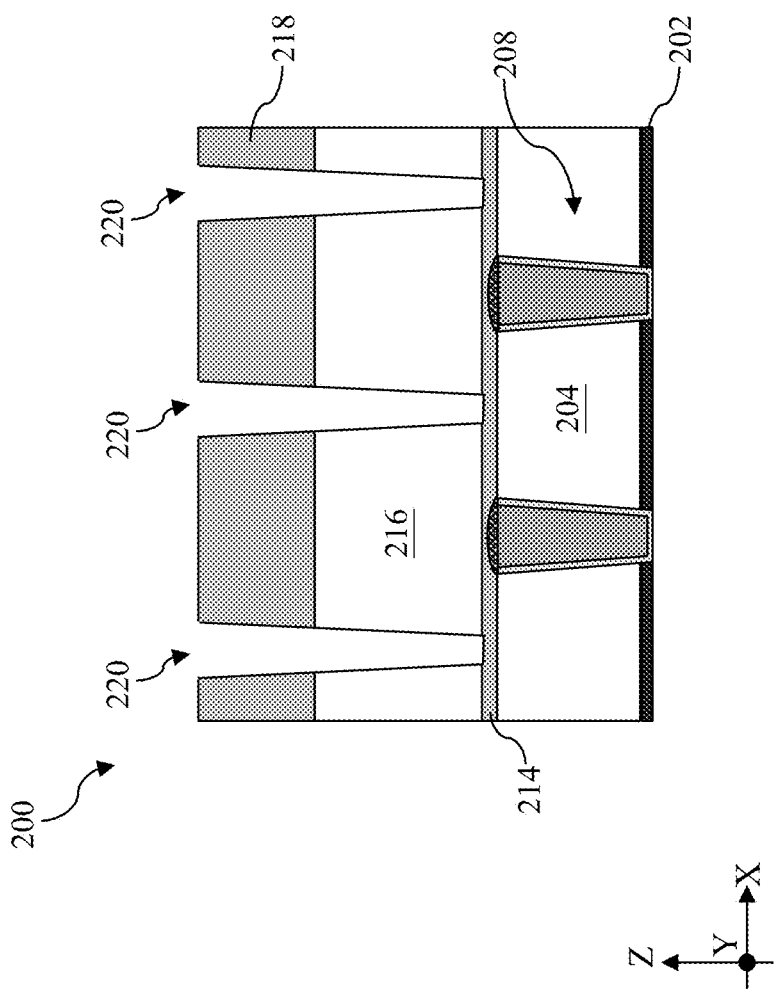
Figure 8:
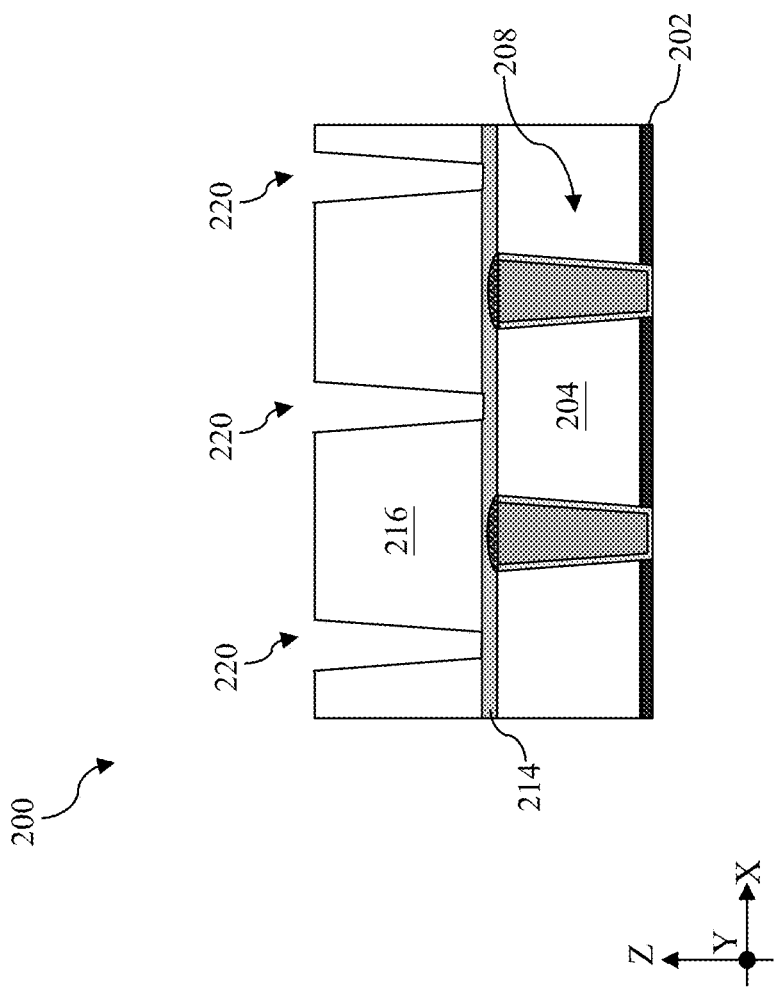

Referring to FIGS. 1 and 5, method 100 includes a block 108 where a semiconductor layer 216 over the ESL 214. In some embodiments, the semiconductor layer 216 is an amorphous silicon (a-Si) layer that is deposited using CVD, PECVD, or low pressure CVD (LPCVD). The deposition of the semiconductor layer 216 may include use of trichlorosilane (SiCl$_3$), silane (SiH$_4$), or a combination thereof. In some implementations, the semiconductor layer 216 has a thickness between about 80 nm and about 100 nm.

Referring to FIGS. 1 and 6-8, method 100 includes a block 110 where the semiconductor layer 216 is patterned to form pillar openings 220. The patterning of the semiconductor layer 216 may include photolithography processes and etching processes. In the depicted embodiment, block 110 includes deposition of a photoresist layer 218 (shown in FIG. 6), photolithographic patterning of the photoresist layer, etching of the semiconductor layer 216 using the patterned photoresist layer 218 as an etch mask (shown in FIG. 7), and selective removal of the photoresist layer 218 (shown in FIG. 8). The photoresist layer 218 may include hydrocarbons and may be deposited using spin-on coating. The etching of the semiconductor layer 216 at block 110 may include dry etching, wet etching, reactive ion etching (RIE), and/or other suitable processes. Because the pillar openings 220 are formed to accommodate pillar features that land on the ESL 214. The etching of the semiconductor layer 216 terminates on or adjacent a top surface of the ESL 214. After the patterning of the semiconductor layer 216 to form the pillar openings 220, the photoresist layer 218 may be removed by ashing or selective etching.

Figure 9:
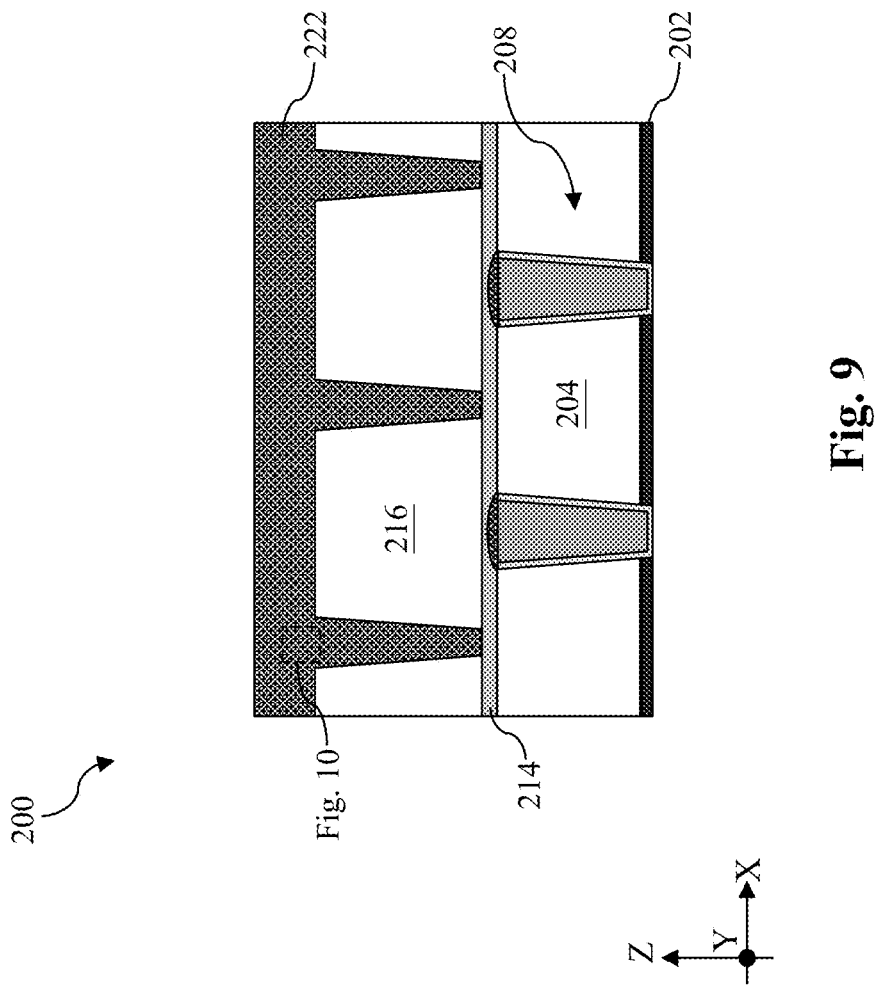

Referring to FIGS. 1 and 9, method 100 includes a block 112 wherein a dielectric material 222 is deposited over the pillar openings 220. In some embodiments, the dielectric material 222 may include diamond, diamond-like carbon, or aluminum nitride (AlN). When the dielectric material 222 includes diamond or diamond-like carbon, the dielectric material 222 may be deposited using CVD or spin-on coating. When the diamond-based dielectric material 222 is deposited using CVD, a carbon-containing gas and hydrogen ($H_2$) may be used and a process temperature may be below 450° C. The carbon-containing gas may include methane, dichloromethane, trichloromethane, or a combination thereof. When the diamond-based dielectric material 222 is deposited using spin-on coating, a dispersed diamond precursor solution with a PH value between 4.0 and 7.0 may be used.

When the dielectric material 222 includes aluminum nitride (AlN), the dielectric material 222 may be a single continuous layer or a sequential layer. When the dielectric material 222 is a single continuous layer, aluminum nitride (AlN) may be deposited using ALD or CVD to fill in the pillar openings. The ALD or CVD deposited aluminum nitride is amorphous or polycrystalline. When the dielectric material 222 is sequential layer, aluminum nitride (AlN) may be deposited through multiple cycles, each of which includes a PVD deposition step and an ultraviolet (UV) anneal step. In some embodiments, each of the PVD deposition step deposits aluminum nitride to a thickness between about 50 Å and about 100 Å. The PVD deposition may include a sputtering process and a high purity aluminum nitride target. After the PVD deposition, the UV anneal step anneal the deposited aluminum nitride layer at a temperature below 450° C. In some embodiments, the UV anneal step is performed in an oxygen or air containing ambient, which forms an aluminum oxynitride layer (or an oxygen-doped aluminum nitride layer) before the PVD deposition of the next aluminum nitride layer. As representatively shown in FIG. 10, when the dielectric material 222 is a sequential layer and is formed using a plurality of the aforementioned cycles, the dielectric material 222 is a multilayer. To illustrate further, a portion of the dielectric material 222 in FIG. 9 is enlarged and shown in FIG. 10. The multilayer may include aluminum nitride sub-layers 2220 and aluminum oxynitride sub-layers 2222 interleaving the aluminum nitride sub-layers 2220. When aluminum nitride is deposited using PVD, the as-deposited aluminum nitride tends to be single crystalline, which increases leakage. The aluminum oxynitride sub-layers 2222 function to reduce leakage due to crystallinity of the aluminum nitride sub-layers 2220.

Figure 10:
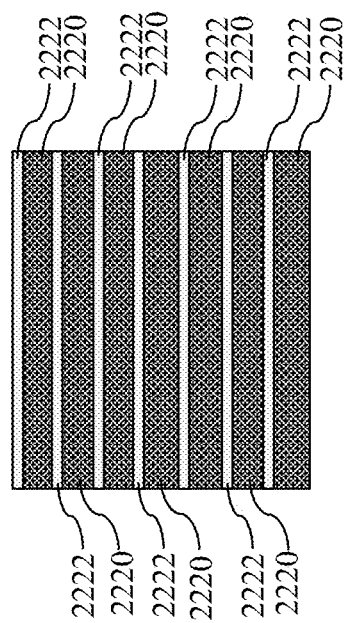
Figure 11:
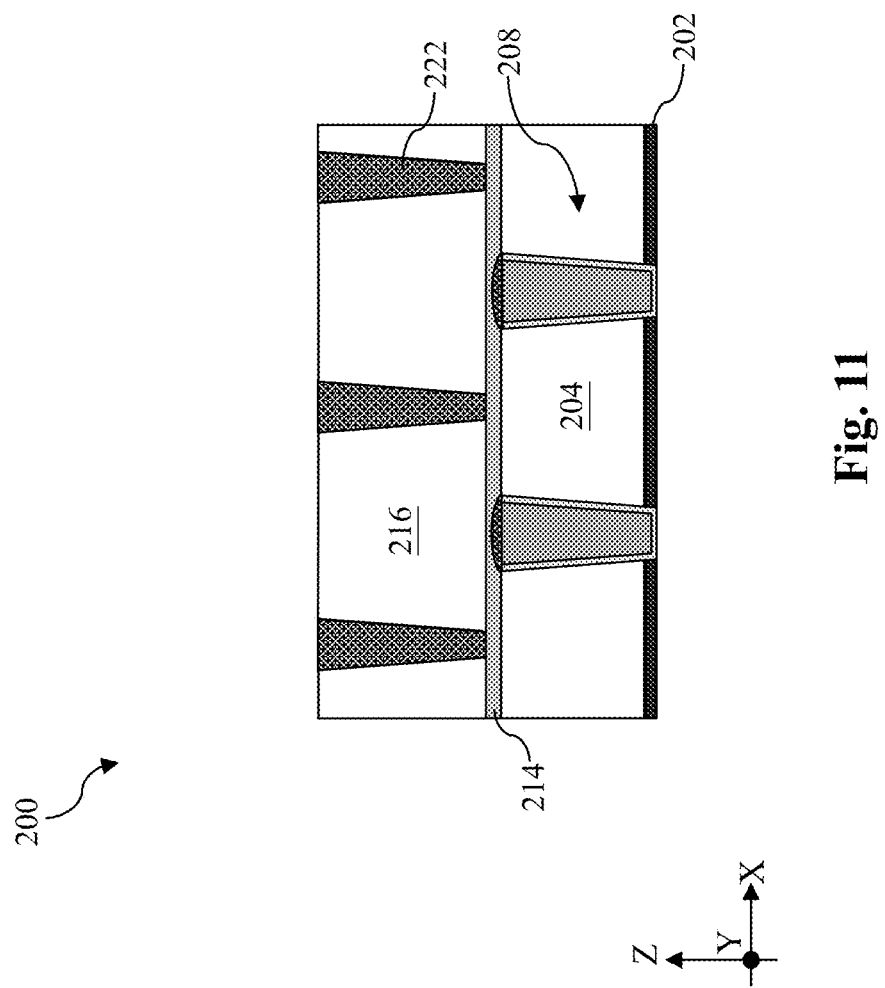

Referring to FIGS. 1 and 11, method 100 includes a block 114 where the workpiece 200 is planarized to form pillar features 222 in the pillar openings 220. The planarization at block 114 may include chemical mechanical polishing (CMP). As shown in FIG. 10, the workpiece 200 is planarized until a top surface of the semiconductor layer 216 is exposed. For ease of reference, the reference numeral of the dielectric material 222 is used to denote the pillar features 222.

Figure 12:
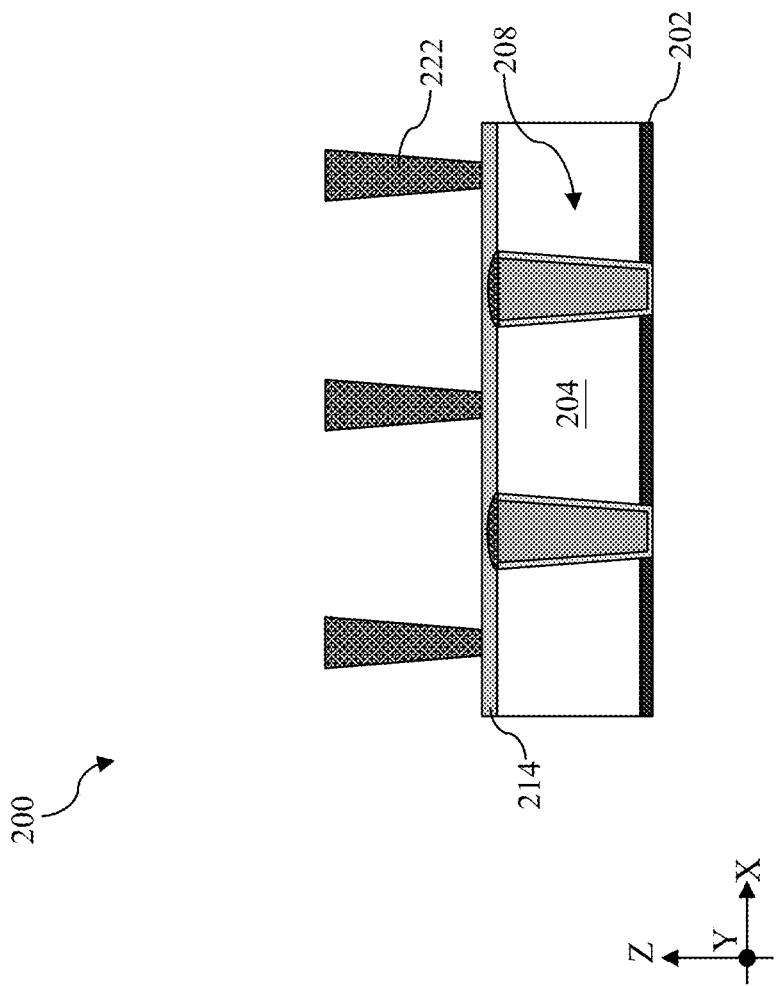

Referring to FIGS. 1 and 12, method 100 includes a block 116 where the semiconductor layer 216 is selectively removed. In some embodiments, the semiconductor layer 216 may be selectively removed using a selective wet etch process or a selective dry etch process. An example selective wet etch process may include use of ethylenediamine pyrocatechol (EDP), tetramethylammonium hydroxide (TMAH), nitric acid ($HNO_3$), hydrofluoric acid (HF), ammonia ($NH_3$), hydrogen peroxide ($H_2O_2$), ammonium fluoride ($NH_4F$) or a suitable wet etchant. An example selective dry etch process to etch the semiconductor layer 216 may include sulfur hexafluoride ($SF_6$), hydrogen ($H_2$), ammonia ($NH_3$), hydrogen fluoride (HF), carbon tetrafluoride ($CF_4$), hydrogen bromide (HBr), argon, or a mixture thereof. As shown in FIG. 12, the selective removal of the semiconductor layer 216 exposes a top surface of the ESL 214.

Figure 13:
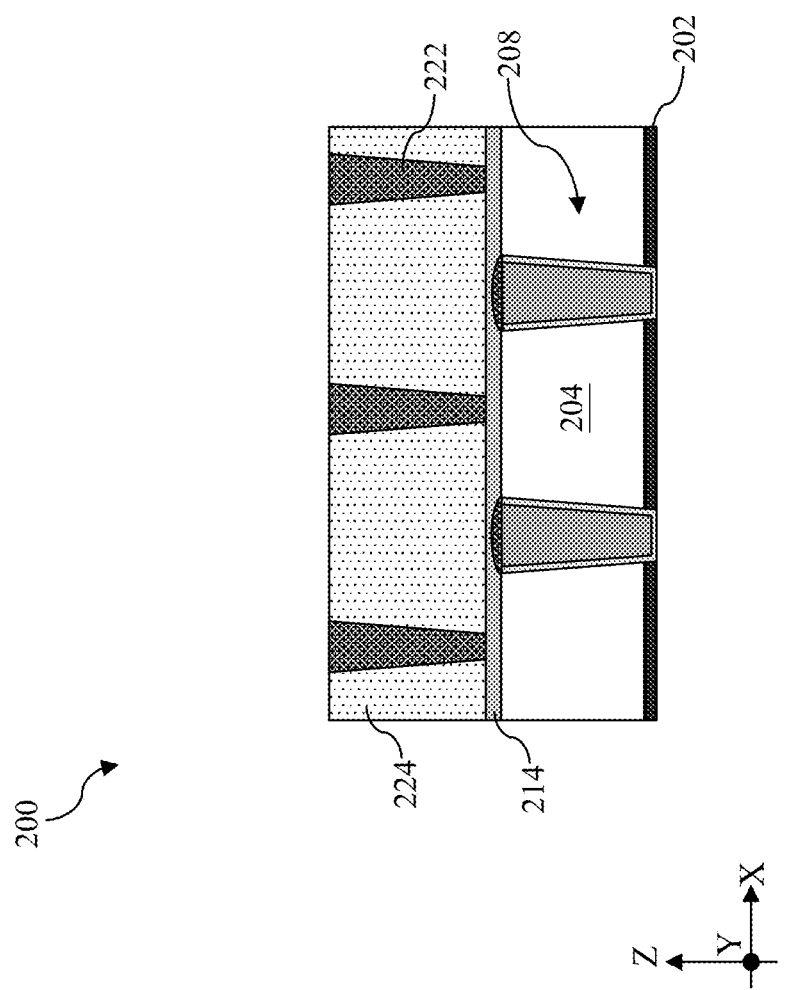

Referring to FIGS. 1 and 13, method 100 includes a block 118 where a polymer layer 224 is deposited over the workpiece 200. While the polymer layer 224 serves as a sacrificial layer and is to be removed in a subsequent step, it is selected such that it can withstand the deposition of a second dielectric layer 228 (to be described below) without becoming structurally compromised. For that reason, the polymer layer 224 needs to be easy to remove and yet to remain stable at least up to a temperature of 300° C. or so, which is about the deposition temperature of the second dielectric layer 228. Based on these criteria, the polymer layer 224 may include polyvinyl alcohol (PVA), polyacrylate, polydimethylsiloxane (PDMS), polycarbonate (PC), or a suitable polymer. Generally speaking, polymers with benzene rings in their monomers may not be suitable as they tend to decompose at a high temperature. In one embodiment, the polymer layer 224 includes PVA, which has a decomposition temperature between 300° C. and about 450° C. The polymer layer 224 may be deposited flowable CVD (FCVD), CVD, spin-on coating, or sol-gel process. After the depositing of the polymer layer 224, a curing process may be performed to cure the polymer layer 224. In some instances, the curing process may include a bake process, an anneal process, a drying process, or a UV radiation process.

Figure 14:
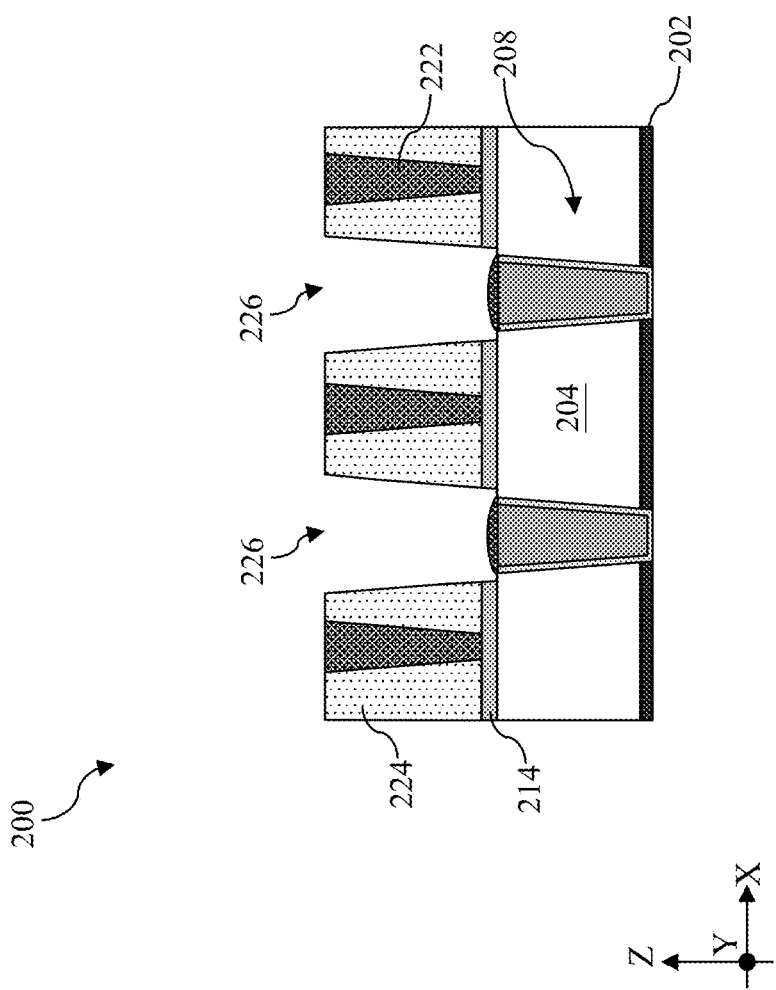

Referring to FIGS. 1 and 14, method 100 includes a block 120 wherein the polymer layer 224 is patterned to form contact openings 226. In some embodiments, the patterning of the polymer layer 224 may be performed using lithography processes and dry etching. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The dry etch process may include a reactive ion etching (RIE) or plasma etching that uses of an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), or a bromine-containing gas (e.g., HBr and/or $CHBr_3$). Contact openings 226 extend through the ESL 214 to expose the first cap layer 212.

Figure 15:
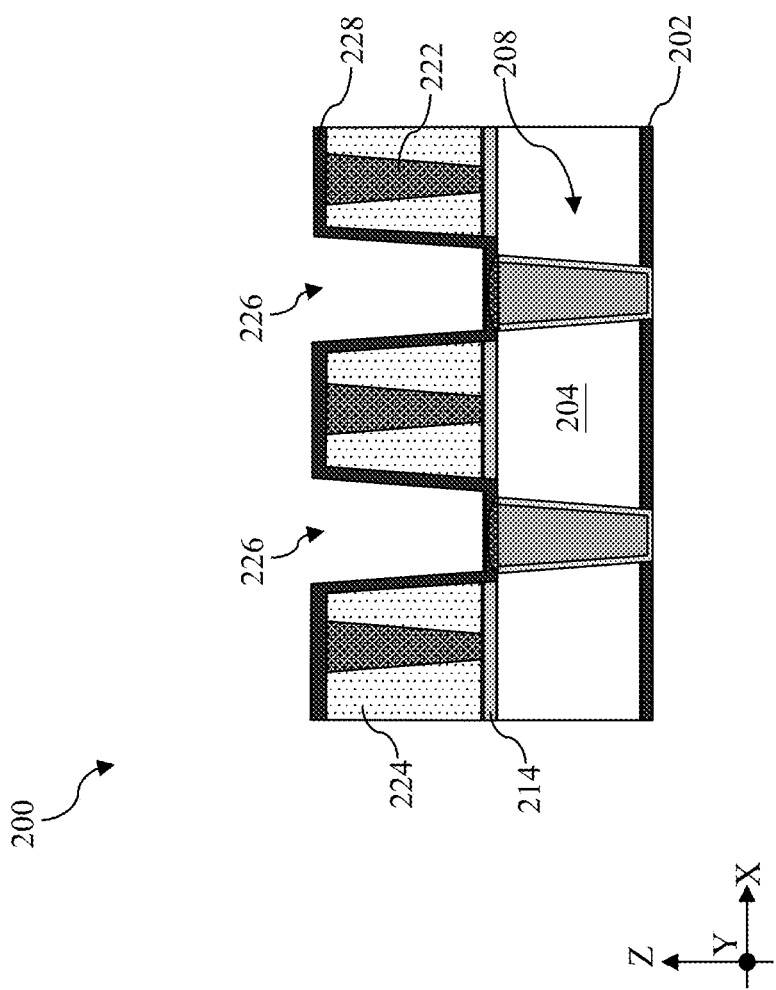

Referring to FIGS. 1 and 15, method 100 includes a block 122 where a second dielectric layer 228 is deposited over the contact openings 226. In some embodiments, the second dielectric layer 228 may include diamond, diamond-like carbon, or aluminum nitride (AlN). When the second dielectric layer 228 includes diamond or diamond-like carbon, the second dielectric layer 228 may be deposited by CVD using a carbon-containing gas and hydrogen ($H_2$). The process temperature for the CVD deposition of the second dielectric layer 228 may be lower than 450° C. The carbon-containing gas may include methane, dichloromethane, trichloromethane, or a combination thereof. When the second dielectric layer 228 includes aluminum nitride (AlN), the second dielectric layer 228 may be deposited using ALD, CVD, or plasma enhanced CVD (PECVD). It is noted that the second dielectric layer 228 is not formed using PVD or the crystallinity of the PVD second dielectric layer 228 may promote leakage. The deposition of the second dielectric layer 228 may include use of an aluminum-containing precursor, such as trimethylaluminum ($Al(CH_3)_3$) and a nitrogen-containing precursor, such as ammonia ($NH_3$). In some implementations, the deposited second dielectric layer 228 may be subject to a plasma treatment that includes helium (He), argon (Ar), or a combination thereof. The plasma treatment may improve the integrity and density of the second dielectric layer 228. As shown in FIG. 15, because the second dielectric layer 228 is conformally deposited over sidewalls of the contact openings 226, the second dielectric layer 228 may serve as an etch stop layer and a liner.

Figure 16:
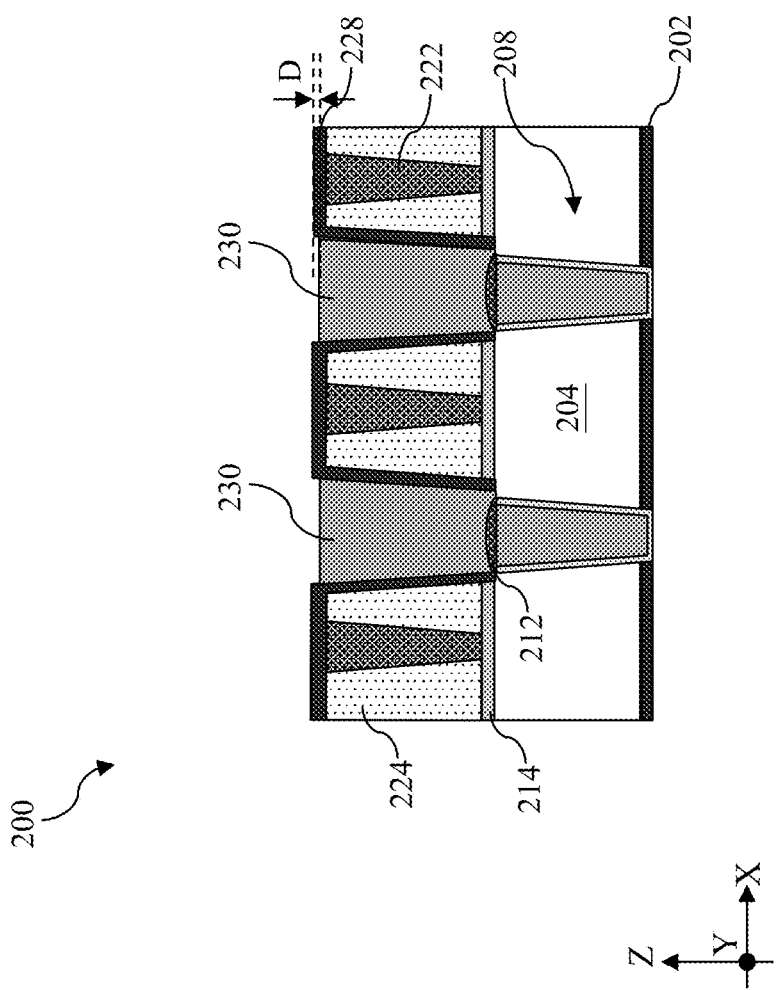

Referring to FIGS. 1 and 16, method 100 includes a block 124 where a metal fill layer is deposited over the contact openings to form a second conductive feature 230. In some embodiments, the metal fill layer (and the second conductive feature 230 formed therefrom) includes copper (Cu), nickel (Ni), cobalt (Co), ruthenium (Ru), iridium (Ir), aluminum (Al), platinum (Pt), palladium (Pd), gold (Au), silver (Ag), osmium (Os), tungsten (W), molybdenum (Mo), or a combination thereof. In one embodiment, the metal fill layer includes copper (Cu). The metal fill layer may be deposited using ALD, CVD, PVD, electrochemical plating (ECP), or electroless deposition (ELD). In one example, the metal fill layer may be deposited using electrochemical plating. In this example process, a seed layer may be deposited over the second dielectric layer 228 using PVD or CVD. The seed layer may include titanium (Ti), copper (Cu), or both. Then copper is deposited over the seed layer using electroplating. After deposition of the metal fill layer, a planarization process, such as a CMP process, is performed to remove excess metal fill layer and to expose the top surface of the second dielectric layer 228. After the planarization process, the second conductive features 230 are formed in the contact openings 226. As shown in FIG. 16, due to loading effect, top surfaces of the second conductive features 230 may be lower than the top surface of the second dielectric layer 228 by a height difference D. In some instances, the height difference D may be between about 0 and about 10 Å. The second dielectric layer 228 over the first cap layer 212 is removed by anisotropic etching to expose the first cap layer 212 before the formation of the second conductive feature 230.

Figure 17:
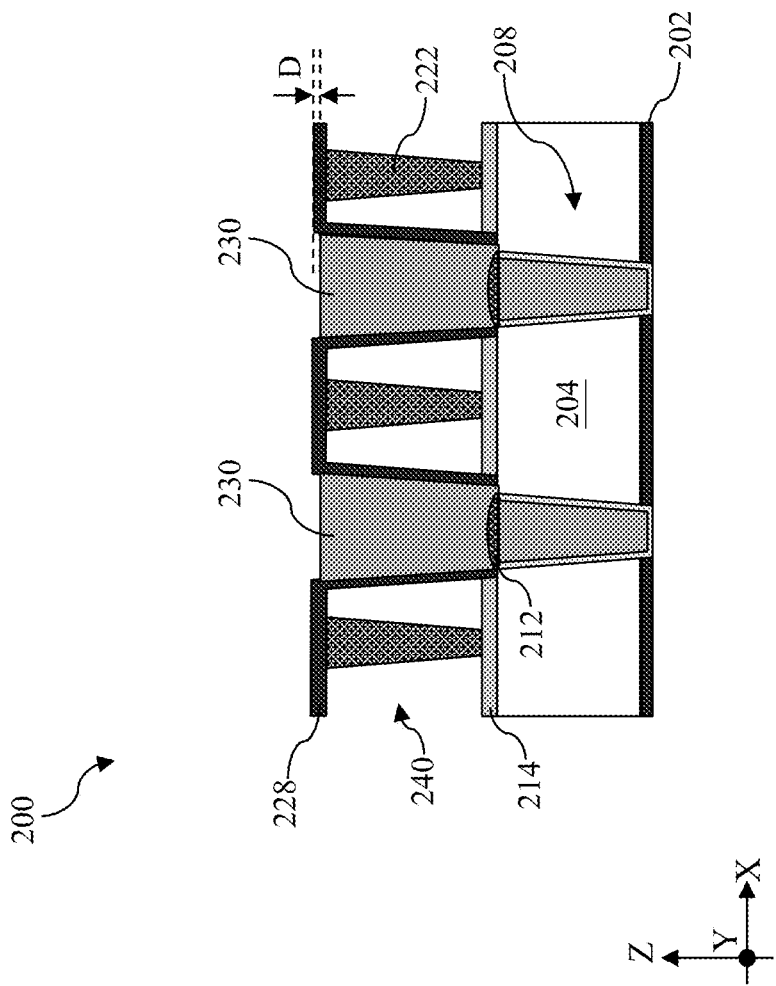

Referring to FIGS. 1 and 17, method 100 includes a block 126 where the polymer layer 224 is selectively removed. In some embodiments, a thermal treatment, such as an anneal process or a bake process, may be performed to decompose the polymer layer 224 into volatile compound, which may be removed from the thermal treatment chamber. In some embodiments, the thermal treatment may have a temperature between about 300° C. and about 450° C. This temperature range is not trivial. When the temperature is below 300° C., the decomposition may happen too slowly, which may increase process time and cost. When the temperature is greater than 450° C., the threshold voltage of the FEOL devices that are already formed may start to drift. When the polymer layer 224 includes PVA, the thermal treatment may cause the polymer layer 224 to decompose and generate water and carboxyl acid as volatile byproducts, which may be removed by pulling a vacuum. After the polymer layer 224 is selectively removed, air gap 240 may be formed in spaces define by the pillar features 222, the second dielectric layer 228, and the ESL 214. Because air has a dielectric constant close to 1, the air gaps 240 lower the effective dielectric constant of the dielectric structures among the second conductive features 230.

Figure 18:
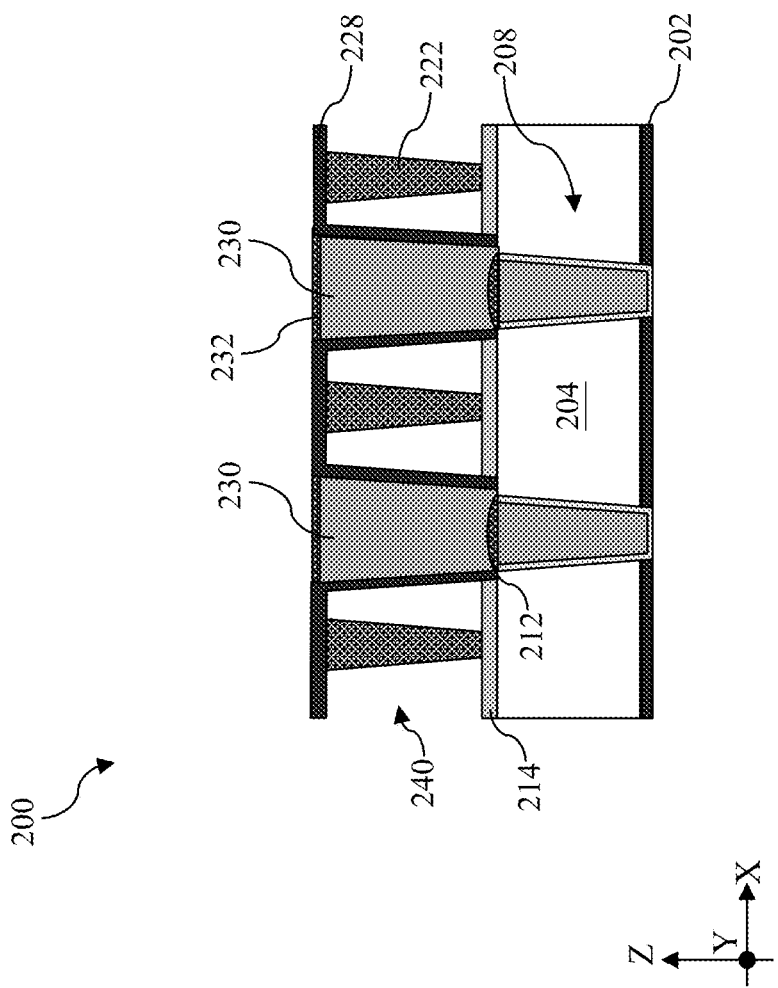

Referring to FIGS. 1 and 18, method 100 incudes a block 128 where a second cap layer 232 is formed over the second conductive feature 230. In some embodiments, the second cap layer 232 includes cobalt (Co). In some implementations, at block 128, the second cap layer 232 may be selectively deposited on top surfaces of the second conductive features 230 by metal organic chemical vapor deposition (MOCVD) using metalorganic precursors each having a metal ion and coordinating ligands. An example cobalt metalorganic precursor may be cyclopentadienylcobalt dicarbonyl (($C_5H_5$)Co($CO$)$_2$). As shown in FIG. 18, due to the selective nature of formation, the second cap layer 232 is only deposited on top surfaces of the second conductive features 230 and is absent from the surfaces of the second dielectric layer 228. When the second cap layer 232 includes cobalt (Co), it may have a slight dome shape similar to that of the first cap layer 212 shown in FIG. 3. In some alternative embodiments, the second cap layer 232 may include silicon nitride.

Figure 19:
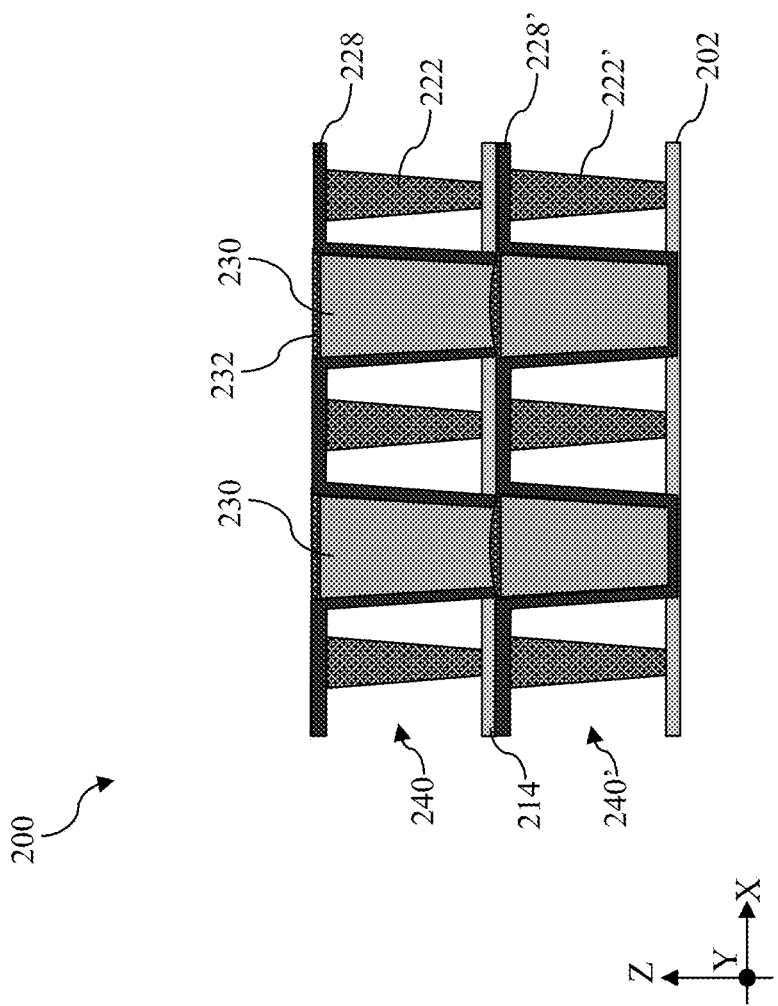
Figure 20:
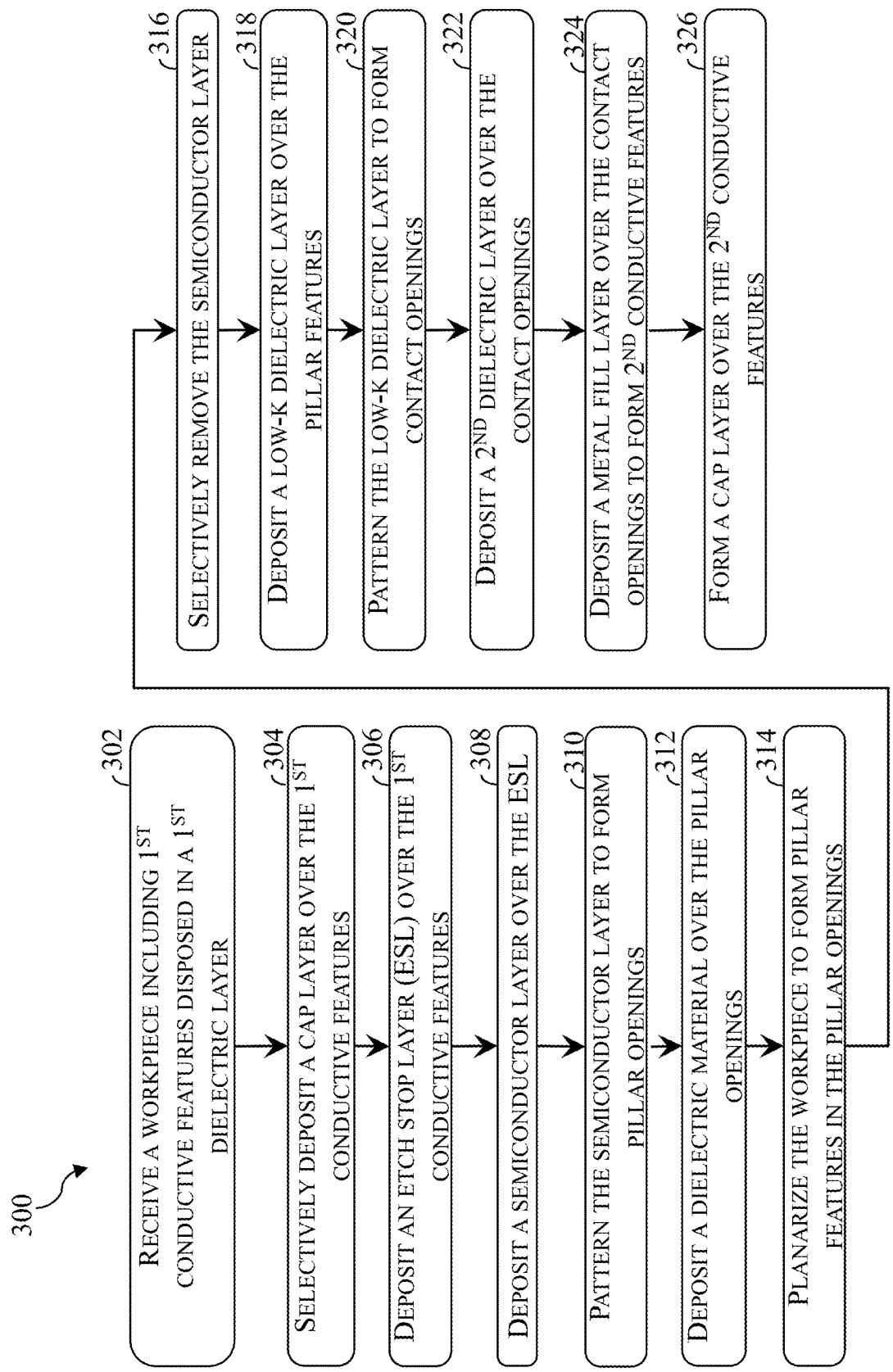
FIG. 20 is a flowchart of a method 300 for forming a contact structure, according to one or more aspects of the present disclosure.

Reference is made to FIG. 19. In some embodiments, method 100 is performed to a workpiece 200 that is formed using the method 100. In FIG. 19, the ESL 214 is deposited on a bottom dielectric layer 228' similar to the second dielectric layer 228. The bottom dielectric layer 228' is in contact with bottom pillar features 222' similar to the pillar features 222. Low dielectric constant is provided by bottom air gaps 240' similar to the air gaps 240.

Method 100 of the present disclosure selectively remove the polymer layer 224 to form air gaps 240 to lower effective dielectric constant and reduce capacitance. Method 300 in FIG. 20 includes an alternative embodiment where a low-k dielectric material is deposited in place of the polymer layer 224 and the low-k dielectric material is not subsequently removed.

Referring to FIGS. 20 and 2, method 300 includes a block 302 where a workpiece 200 that includes a first conductive feature 208 disposed in a first dielectric layer 204 is received. Operations at block 302 are similar to those in block 102. Particularly, the workpiece 200 undergoing method 300 may be the same as the workpiece 200 undergoing method 100. For this reasons, detailed description of the operations at block 302 is omitted for brevity.

Referring to FIGS. 20 and 3, method 300 includes a block 304 where a first cap layer 212 is selectively deposited over the first conductive feature 208. Operations at block 304 are similar to those in block 104. For this reasons, detailed description of operations at block 304 is omitted for brevity.

Referring to FIGS. 20 and 4, method 300 includes a block 306 where an etch stop layer (ESL) 214 is deposited over the first conductive feature 208. Operations at block 306 are similar to those in block 106. For this reasons, detailed description of operations at block 306 is omitted for brevity.

Referring to FIGS. 20 and 5, method 300 includes a block 308 where a semiconductor layer 216 over the ESL 214.

Operations at block 308 are similar to those in block 108. For this reasons, detailed description of operations at block 308 is omitted for brevity.

Referring to FIGS. 20 and 6-8, method 300 includes a block 310 where the semiconductor layer 216 is patterned to form pillar openings 220. Operations at block 310 are similar to those in block 110. For this reasons, detailed description of operations at block 310 is omitted for brevity.

Referring to FIGS. 20 and 9, method 100 includes a block 312 wherein a dielectric material 222 is deposited over the pillar openings 220. Operations at block 312 are similar to those in block 112. For this reasons, detailed description of operations at block 312 is omitted for brevity.

Referring to FIGS. 20 and 11, method 300 includes a block 314 where the workpiece 200 is planarized to form pillar features 222 in the pillar openings 220. Operations at block 314 are similar to those in block 114. For this reasons, detailed description of operations at block 314 is omitted for brevity.

Referring to FIGS. 20 and 12, method 300 includes a block 316 where the semiconductor layer 216 is selectively removed. Operations at block 316 are similar to those in block 116. For this reasons, detailed description of operations at block 316 is omitted for brevity.

Figure 21:
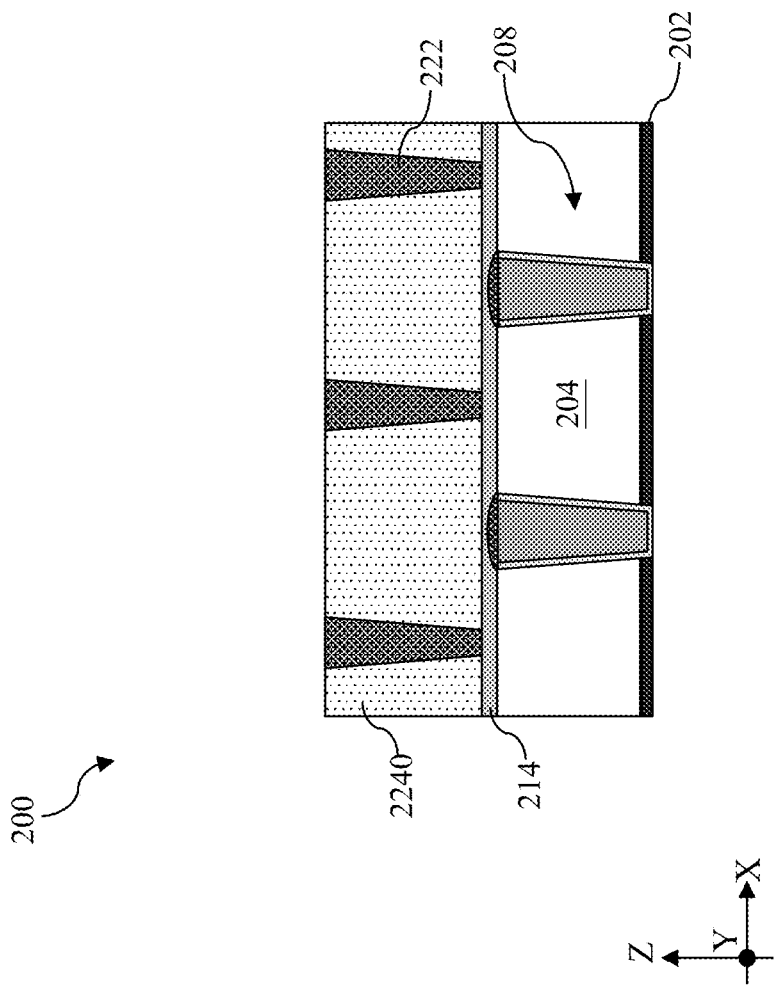
FIGS. 21-26 are fragmentary cross-sectional views of a workpiece at various stages of fabrication according to the method in FIG. 20, according to one or more aspects of the present disclosure.

Referring to FIGS. 20 and 21, method 300 includes a block 318 where a low-k dielectric layer 2240 is deposited over the pillar features 222. The low-k dielectric layer 2240 may include a porous organosilicate thin film (e.g., SiOCH), tetraethylorthosilicate (TEOS) oxide, un-doped silicate glass, borophosphosilicate glass (BPSG), fluorosilicate glass (FSG), phosphosilicate glass (PSG), fluorine-doped silicon dioxide, carbon-doped silicon dioxide, porous silicon dioxide, porous carbon-doped silicon dioxide, silicon oxycarbonitride (SiOCN), boron carbonitride (BCN), spin-on silicon based polymeric dielectrics, or combinations thereof. In one embodiment, the low-k dielectric layer 2240 includes boron carbonitride (BCN). The low-k dielectric layer 2240 may be deposited using CVD, flowable CVD, or spin-on coating.

Figure 22:
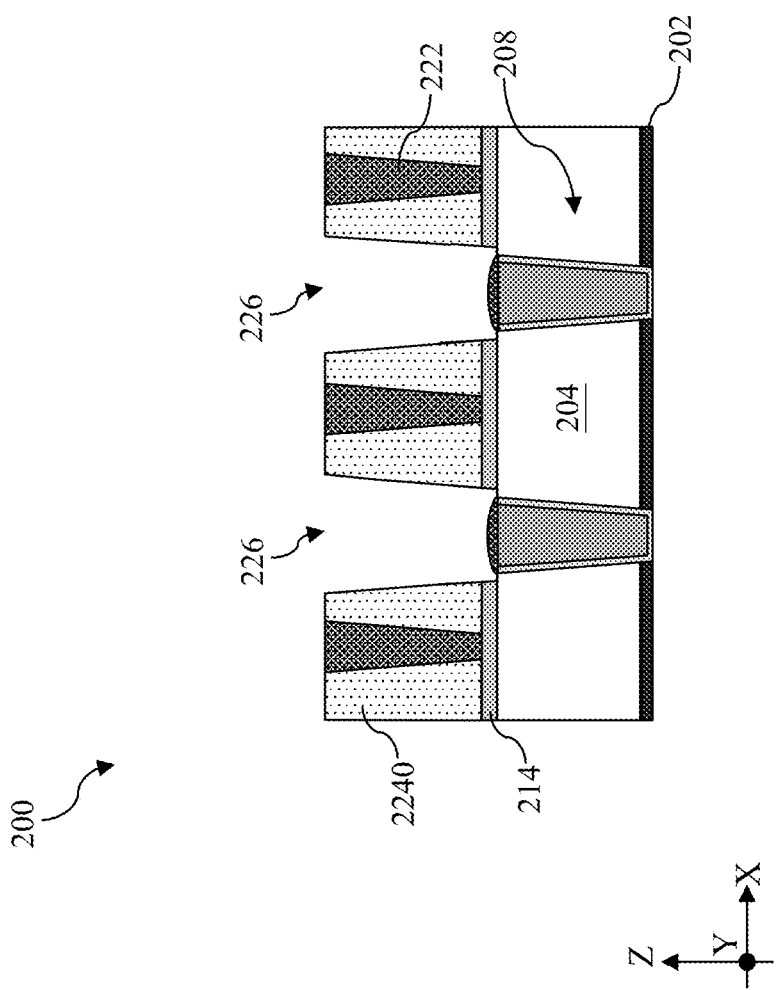

Referring to FIGS. 20 and 22, method 300 includes a block 320 where the low-k dielectric layer 2240 is patterned to form contact openings 226. In some embodiments, the patterning of the low-k dielectric layer 2240 may be performed using lithography processes and dry etching. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The dry etch process may include a reactive ion etching (RIE) or plasma etching that uses of an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), or a bromine-containing gas (e.g., HBr and/or $CHBr_3$). Contact openings 226 extend through the ESL 214 to expose the first cap layer 212.

Figure 23:
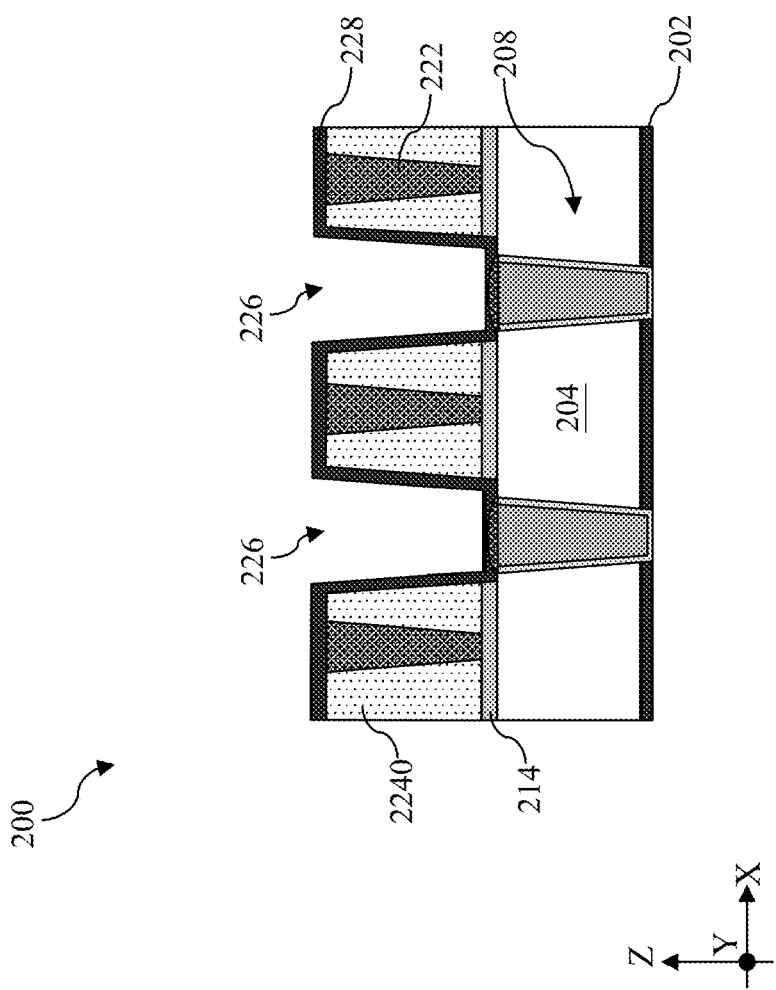

Referring to FIGS. 20 and 23, method 300 includes a bock 322 wherein a second dielectric layer 228 is conformally deposited over the contact openings 226. In some embodiments, the second dielectric layer 228 may include diamond, diamond-like carbon, or aluminum nitride (AlN). When the second dielectric layer 228 includes diamond or diamond-like carbon, the second dielectric layer 228 may be deposited by CVD using a carbon-containing gas and hydrogen ($H_2$). The process temperature for the CVD deposition of the second dielectric layer 228 may be lower than 450° C. The carbon-containing gas may include methane, dichloromethane, trichloromethane, or a combination thereof. When the second dielectric layer 228 includes aluminum nitride (AlN), the second dielectric layer 228 may be deposited using ALD, CVD, or plasma enhanced CVD (PECVD). It is noted that the second dielectric layer 228 is not formed using PVD or the crystallinity of the PVD second dielectric layer 228 may promote leakage. The deposition of the second dielectric layer 228 may include use of an aluminum-containing precursor, such as trimethylaluminum (Al($CH_3$)$_3$) and a nitrogen-containing precursor, such as ammonia ($NH_3$). In some implementations, the deposited second dielectric layer 228 may be subject to a plasma treatment that includes helium (He), argon (Ar), or a combination thereof. The plasma treatment may improve the integrity and density of the second dielectric layer 228. As shown in FIG. 23, because the second dielectric layer 228 is conformally deposited over sidewalls of the contact openings 226, the second dielectric layer 228 may serve as an etch stop layer and a liner.

Figure 24:
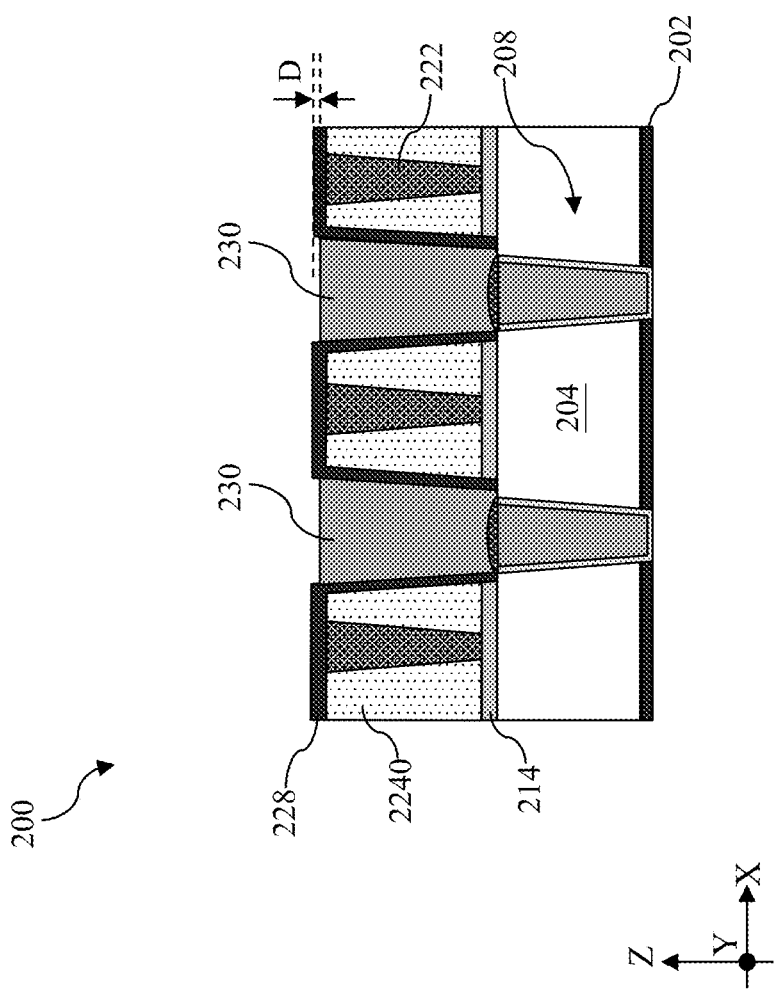

Referring to FIGS. 20 and 24, method 300 includes a block 324 where a metal fill layer is deposited over the contact openings 226 to form second conductive features 230. In some embodiments, the metal fill layer (and the second conductive feature 230 formed therefrom) includes copper (Cu), nickel (Ni), cobalt (Co), ruthenium (Ru), iridium (Ir), aluminum (Al), platinum (Pt), palladium (Pd), gold (Au), silver (Ag), osmium (Os), tungsten (W), molybdenum (Mo), or a combination thereof. In one embodiment, the metal fill layer includes copper (Cu). The metal fill layer may be deposited using ALD, CVD, PVD, electrochemical plating (ECP), or electroless deposition (ELD). In one example, the metal fill layer may be deposited using electrochemical plating. In this example process, a seed layer may be deposited over the second dielectric layer 228 using PVD or CVD. The seed layer may include titanium (Ti), copper (Cu), or both. Then copper is deposited over the seed layer using electroplating. After deposition of the metal fill layer, a planarization process, such as a CMP process, is performed to remove excess metal fill layer and to expose the top surface of the second dielectric layer 228. After the planarization process, the second conductive features 230 are formed in the contact openings 226. As shown in FIG. 24, due to loading effect, top surfaces of the second conductive features 230 may be lower than the top surface of the second dielectric layer 228 by a height difference D. In some instances, the height difference D may be between about 0 and about 10 Å. The second dielectric layer 228 over the first cap layer 212 is removed by anisotropic etching to expose the first cap layer 212 before the formation of the second conductive feature 230.

Figure 25:
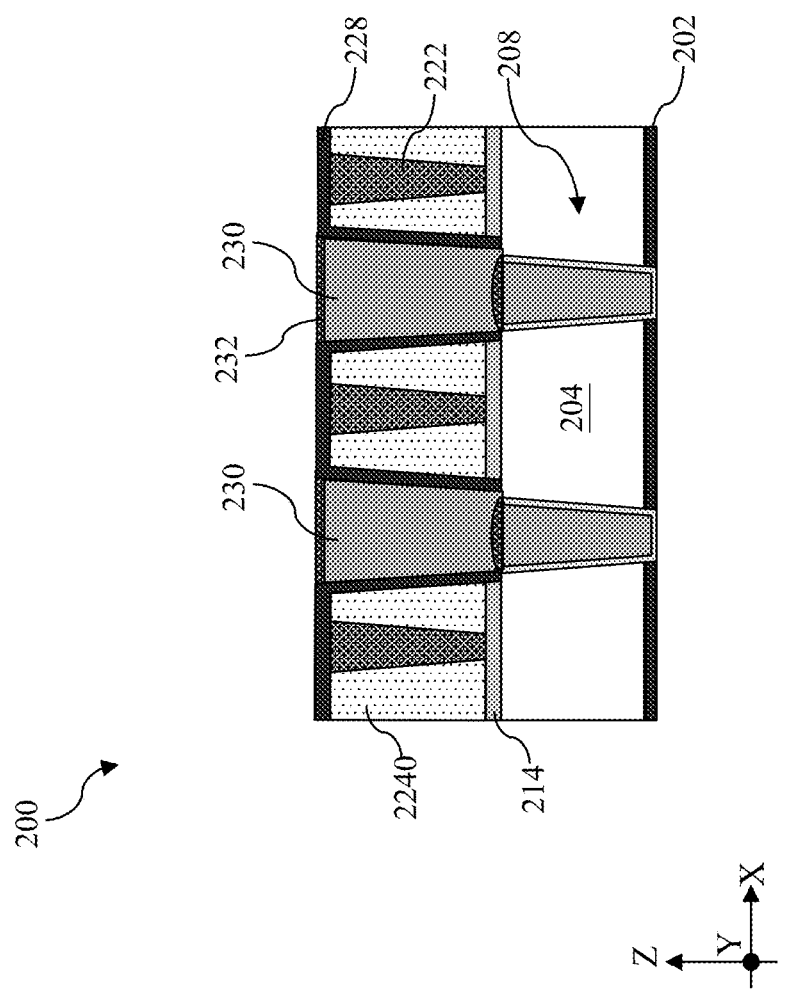
Figure 26:
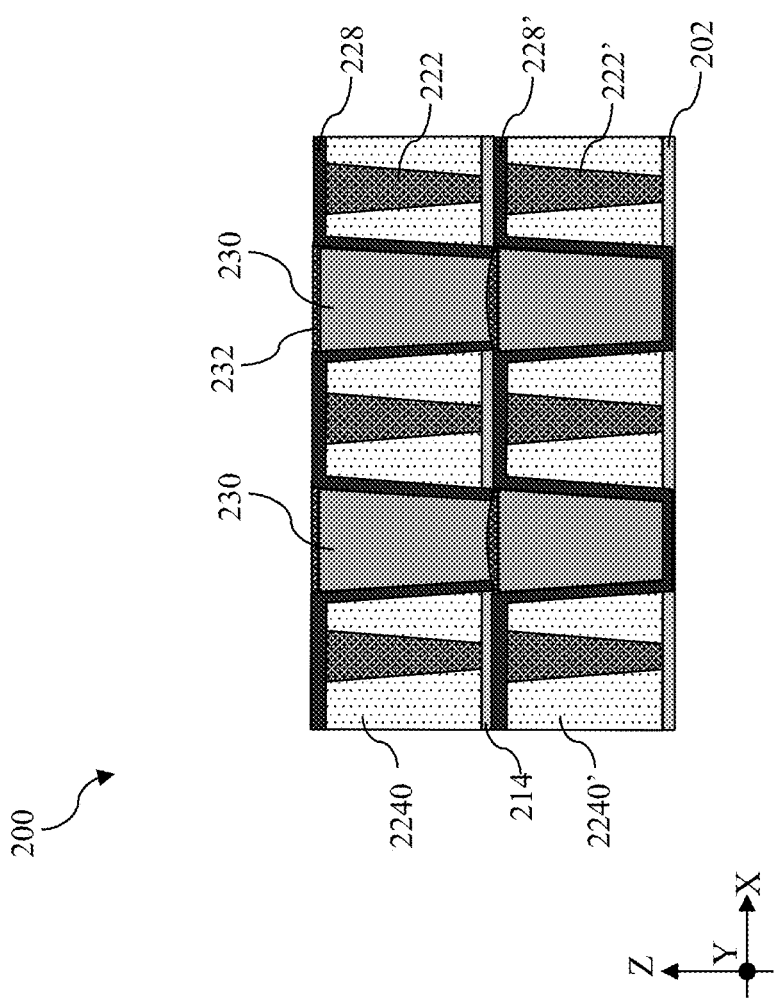
Figure 26:
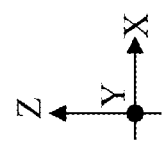

Referring to FIGS. 20 and 25, method 300 includes a block 326 where a second cap layer 232 is formed over the second conductive features 230. In some embodiments, the second cap layer 232 includes cobalt (Co). In some implementations, at block 326, the second cap layer 232 may be selectively deposited on top surfaces of the second conductive features 230 by metal organic chemical vapor deposition (MOCVD) using metalorganic precursors each having a metal ion and coordinating ligands. An example cobalt metalorganic precursor may be cyclopentadienylcobalt dicarbonyl (($C_5H_5$)Co(CO)$_2$). As shown in FIG. 25, due to the selective nature of formation, the second cap layer 232 is only deposited on top surfaces of the second conductive features 230 and is absent from the surfaces of the second dielectric layer 228. In some implementations, the second conductive features 230 are selectively etched or recessed before the formation of the second cap layer 232. In some alternative embodiments, the second cap layer 232 may include silicon nitride.

Reference is made to FIG. 25. In some embodiments, method 300 is performed to a workpiece 200 that is formed using the method 300. In FIG. 25, the ESL 214 is deposited on a bottom dielectric layer 228' similar to the second dielectric layer 228. The bottom dielectric layer 228' is in contact with bottom pillar features 222' similar to the pillar features 222. Low dielectric constant is provided by a bottom low-k dielectric layer 2240' similar to the low-k dielectric layer 2240.

Thus, one of the embodiments of the present disclosure provides a contact structure. The contact structure includes an etch stop layer (ESL), a first pillar feature and a second pillar feature disposed on the ESL, a metal feature disposed between the first pillar feature and the second pillar feature and including a first sidewall, a bottom surface, a second sidewall, and a top surface, a dielectric liner extending continuously from a top surface of the first pillar feature, along the first sidewall, the bottom surface and the second sidewall of the metal feature, and onto a top surface of the second pillar feature, and a gap between the first pillar feature and a portion of the dielectric liner that extends along the first sidewall of the metal feature.

In some embodiments, wherein the ESL includes aluminum nitride (AlN). In some embodiments, the first pillar feature and the second pillar feature include diamond, aluminum oxynitride or aluminum nitride. In some implementations, the dielectric liner includes aluminum nitride or diamond. In some embodiments, the contact structure further includes a metal cap disposed on the top surface of the metal feature. In some embodiments, the metal feature includes copper (Cu) and the metal cap includes cobalt (Co). In some embodiments, the first pillar feature and the second pillar feature are in contact with the ESL.

In another of the embodiments, a method is provided. The method includes depositing a semiconductor layer over an etch stop layer (ESL), patterning the semiconductor layer to form pillar openings that expose the ESL, depositing a dielectric material over the pillar openings and the semiconductor layer, planarizing the dielectric material to form pillar features in the pillar openings, after the planarizing, selectively removing the semiconductor layer, after the selectively removing, depositing a polymer layer over the pillar features, patterning the polymer layer to form contact openings among the pillar features, conformally depositing a dielectric liner over the contact openings, forming a conductive feature over the contact openings, and after the forming of the conductive feature, selectively removing the polymer layer.

In some embodiments, the semiconductor layer includes amorphous silicon (a-Si). In some implementations, the dielectric material includes diamond, aluminum oxynitride or aluminum nitride. In some embodiments, the selectively removing of the polymer layer includes performing a thermal treatment at a temperature between about 300° C. and about 450° C. In some embodiments, the method further includes after the selectively removing of the polymer layer, depositing a cap layer over the conductive feature. In some embodiments, the polymer layer includes polyvinyl alcohol (PVA), polyacrylate, polydimethylsiloxane (PDMS), polycarbonate (PC). In some embodiments, the dielectric liner includes diamond or aluminum nitride. In some embodiments, the depositing of the dielectric material includes performing a plurality of cycles, wherein each of the plurality of cycles includes depositing an aluminum nitride layer by physical vapor depositing and performing an ultraviolet (UV) anneal on the aluminum nitride layer. In some embodiments, the aluminum nitride layer includes a thickness between about 50 Å and about 100 Å.

In yet another of the embodiments, a method is provided. The method includes depositing a silicon layer over an etch stop layer (ESL), patterning the silicon layer to form pillar openings that expose the ESL, depositing a dielectric material over the pillar openings and the silicon layer, planarizing the dielectric material to form pillar features in the pillar openings, after the planarizing, selectively removing the silicon layer, after the selectively removing, depositing a low-k dielectric layer over the pillar features, patterning the low-k dielectric layer to form contact openings among the pillar features, conformally depositing a dielectric liner over the contact openings, depositing a metal fill layer over the contact openings, and selectively depositing a metal cap over the metal fill layer.

In some embodiments, the dielectric material includes diamond, aluminum oxynitride, or aluminum nitride. In some embodiments, the dielectric liner includes diamond or aluminum nitride. In some implementations, the low-k dielectric layer includes boron carbonitride (BCN) or silicon oxycarbonitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
depositing a semiconductor layer over an etch stop layer (ESL);
patterning the semiconductor layer to form pillar openings that expose the ESL;
depositing a dielectric material over the pillar openings and the semiconductor layer;
planarizing the dielectric material to form pillar features in the pillar openings;
after the planarizing, selectively removing the semiconductor layer;
after the selectively removing, depositing a polymer layer over the pillar features;
patterning the polymer layer to form contact openings among the pillar features;
conformally depositing a dielectric liner over the contact openings;
forming a conductive feature over the contact openings; and
after the forming of the conductive feature, selectively removing the polymer layer.

2. The method of claim 1, wherein the semiconductor layer comprises amorphous silicon (a-Si).

3. The method of claim 1, wherein the dielectric material comprises diamond, aluminum oxynitride or aluminum nitride.

4. The method of claim 1, wherein the selectively removing of the polymer layer comprises performing a thermal treatment at a temperature between about 300° C. and about 450° C.

5. The method of claim 1, further comprising:
after the selectively removing of the polymer layer, depositing a cap layer over the conductive feature.

6. The method of claim 1, wherein the polymer layer comprises polyvinyl alcohol (PVA), polyacrylate, polydimethylsiloxane (PDMS), polycarbonate (PC).

7. The method of claim 1, wherein the dielectric liner comprises diamond or aluminum nitride.

8. The method of claim 1, wherein the depositing of the dielectric material comprises performing a plurality of cycles, wherein each of the plurality of cycles comprises:
depositing an aluminum nitride layer by physical vapor depositing; and
performing an ultraviolet (UV) anneal on the aluminum nitride layer.

9. The method of claim 8, wherein the aluminum nitride layer comprises a thickness between about 50 Å and about 100 Å.

10. A method, comprising:
depositing a silicon layer over an etch stop layer (ESL);
patterning the silicon layer to form pillar openings that expose the ESL;
depositing a dielectric material over the pillar openings and the silicon layer;
planarizing the dielectric material to form pillar features in the pillar openings;
after the planarizing, selectively removing the silicon layer;
after the selectively removing, depositing a low-k dielectric layer over the pillar features;
patterning the low-k dielectric layer to form contact openings among the pillar features;
conformally depositing a dielectric liner over the contact openings;
depositing a metal fill layer over the contact openings; and
selectively depositing a metal cap over the metal fill layer.

11. The method of claim 10, wherein the dielectric material comprises diamond, aluminum oxynitride, or aluminum nitride.

12. The method of claim 10, wherein the dielectric liner comprises diamond or aluminum nitride.

13. The method of claim 10, wherein the low-k dielectric layer comprises boron carbonitride (BCN) or silicon oxycarbonitride.

14. A method, comprising:
forming a first conductive feature in a dielectric layer;
selectively depositing a cap layer over the first conductive feature;
depositing an etch stop layer (ESL) over the dielectric layer and the cap layer;
depositing a semiconductor layer over the ESL;
patterning the semiconductor layer to form pillar openings that expose the ESL;
depositing a dielectric material over the pillar openings and the semiconductor layer;
planarizing the dielectric material to form pillar features in the pillar openings;
after the planarizing, selectively removing the semiconductor layer;
after the selectively removing, depositing a polymer layer over the pillar features;
patterning the polymer layer to form contact openings among the pillar features;
conformally depositing a dielectric liner over the contact openings;
forming a conductive feature over the contact openings; and
after the forming of the conductive feature, selectively removing the polymer layer,
wherein a thermal conductivity of the dielectric material is greater than a thermal conductivity of the dielectric layer.

15. The method of claim 13, wherein the semiconductor layer comprises amorphous silicon (a-Si).

16. The method of claim 13, wherein the dielectric layer comprises a porous organosilicate thin film, tetraethylorthosilicate (TEOS) oxide, un-doped silicate glass, borophosphosilicate glass (BPSG), fluorosilicate glass (FSG), phosphosilicate glass (PSG), fluorine-doped silicon dioxide, carbon-doped silicon dioxide, porous silicon dioxide, porous carbon-doped silicon dioxide, silicon oxycarbonitride (SiOCN), boron carbonitride, or a spin-on silicon based polymeric dielectric.

17. The method of claim 13, wherein the dielectric material comprises diamond, aluminum oxynitride or aluminum nitride.

18. The method of claim 13, wherein the polymer layer comprises polyvinyl alcohol (PVA), polyacrylate, polydimethylsiloxane (PDMS), polycarbonate (PC).

19. The method of claim 13, wherein the dielectric liner comprises diamond or aluminum nitride.

20. The method of claim 13, wherein the cap layer comprises titanium (Ti), tantalum (Ta), molybdenum (Mo), nickel (Ni), cobalt (Co), ruthenium (Ru), or tungsten (W).

* * * * *